United States Patent
Tom et al.

(10) Patent No.: US 8,091,060 B1
(45) Date of Patent: Jan. 3, 2012

(54) CLOCK DOMAIN PARTITIONING OF PROGRAMMABLE INTEGRATED CIRCUITS

(75) Inventors: Marvin Tom, Mountain View, CA (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 409 days.

(21) Appl. No.: 12/368,435

(22) Filed: Feb. 10, 2009

(51) Int. Cl.
G06F 17/50 (2006.01)

(52) U.S. Cl. ........ 716/121; 716/108; 716/119; 716/125; 716/126; 716/130; 716/131; 716/132; 716/137

(58) Field of Classification Search .................. 716/108, 716/119, 121, 125, 126, 130, 131, 132, 137
See application file for complete search history.

(56) References Cited

U.S. PATENT DOCUMENTS

| | | | | |
|---|---|---|---|---|
| 7,203,919 | B2 * | 4/2007 | Suaris et al. | 716/108 |
| 7,237,214 | B1 * | 6/2007 | Pandey et al. | 716/131 |
| 7,353,485 | B1 * | 4/2008 | Kannan et al. | 716/121 |
| 2007/0245281 | A1 * | 10/2007 | Riepe et al. | 716/9 |
| 2009/0178017 | A1 * | 7/2009 | Gupta et al. | 716/15 |

* cited by examiner

*Primary Examiner* — Helen Rossoshek
(74) *Attorney, Agent, or Firm* — Kevin T. Cuenot; Lois D. Cartier

(57) ABSTRACT

A computer-implemented method of partitioning a circuit design into clock domains for implementation within a programmable integrated circuit (IC) can include storing a plurality of constraints that depend upon a plurality of variables, wherein the plurality of constraints regulate placement of components to different clock regions of the programmable IC. The method can include storing an objective function and determining a result indicating whether a feasible solution exists for clock domain partitioning of the circuit design by minimizing the objective function subject to the plurality of constraints. The result can be output.

12 Claims, 1 Drawing Sheet

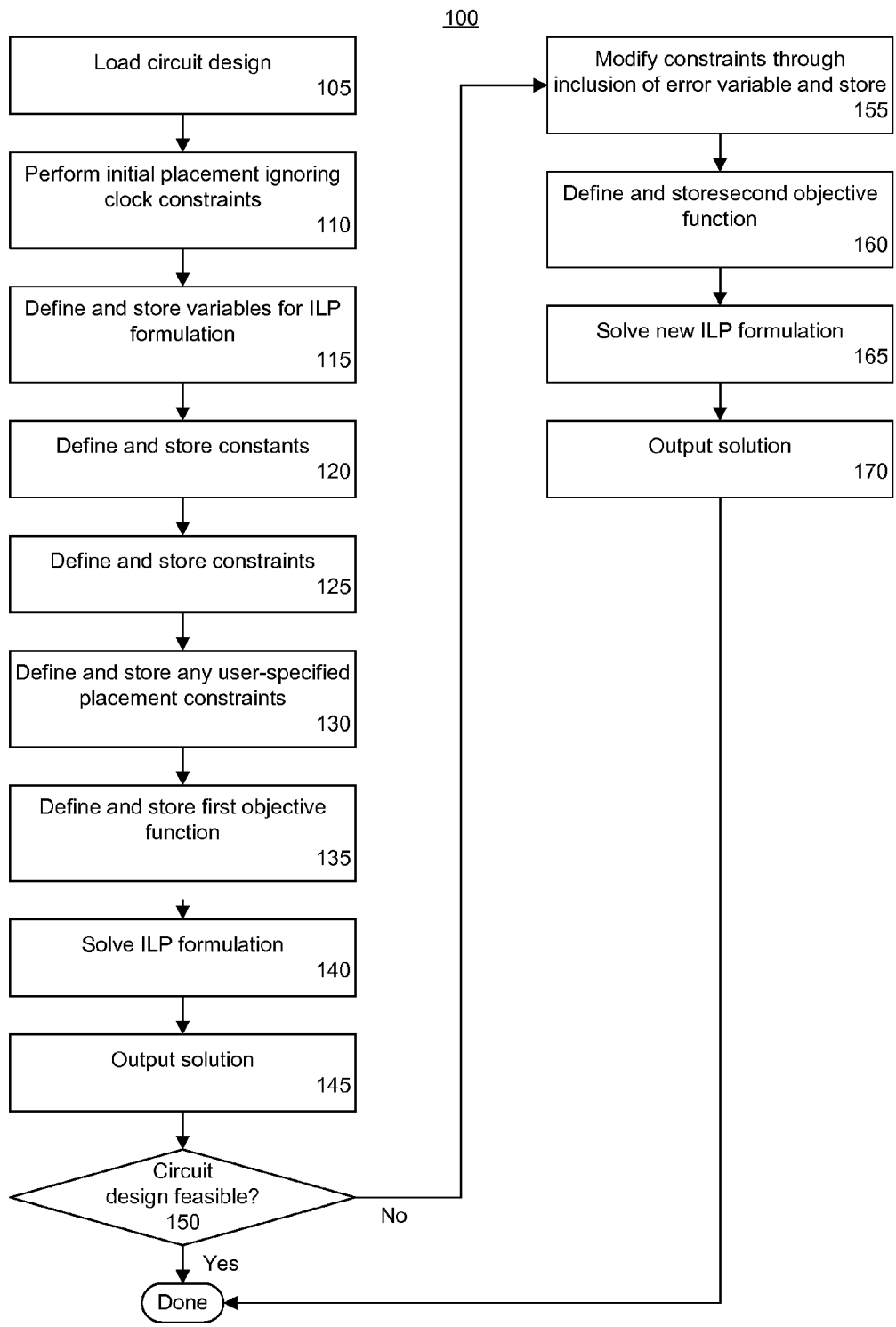

CLOCK DOMAIN PARTITIONING OF PROGRAMMABLE INTEGRATED CIRCUITS

FIELD OF THE INVENTION

The embodiments disclosed herein relate to integrated circuit devices (ICs). More particularly, the embodiments relate to partitioning a circuit design into clock domains for implementation within a programmable IC.

BACKGROUND OF THE INVENTION

Programmable integrated circuits (ICs) are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Other types of programmable ICs can include complex programmable logic devices (CPLDs), programmable logic arrays (PLAs), and programmable array logic (PAL) devices. For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include but is not limited to these exemplary devices and can encompass devices that are only partially programmable. For example, one type of programmable IC includes a combination of hard-coded transistor logic and a programmable switch fabric that programmably interconnects the hard-coded transistor logic.

As noted, programmable ICs can include a variety of different programmable hardware units, e.g., tiles in the case of an FPGA which include LUTs, flip-flops, memory blocks, and the like. These programmable hardware units are distributed on the programmable IC in a regular pattern. To implement a circuit design, each of the hardware units must be programmed, e.g., configured, to implement or function as a particular circuit component of the circuit design. Many components also require a global clock to function. A global clock refers to a periodic signal used to synchronize computational tasks of a circuit.

Most programmable ICs can support multiple global clocks. Each computational element can be synchronized by any of the global clocks on the device. Most programmable ICs will include M global clocks, where M is an integer that is greater than zero. Due to the highly programmable nature of programmable ICs, it is typically the case that only a limited number of the global clocks can be distributed to any one clock region. A "clock region" refers to a physical area or portion on the programmable IC, such as a rectangular area on the programmable IC. Thus, while the programmable IC may have M global clocks, only N global clocks are available in any single clock region, where N is an integer that is less than M.

Assigning a component of the circuit design to a particular hardware unit of the programmable IC so that the hardware unit is programmed to perform the function of the component is referred to as "placing" the component on the programmable IC. The term "site" is used to represent the hardware unit at a particular location on the programmable IC. Thus, components of the circuit design must be placed at sites on the programmable IC in a manner that does not result in more than N clocks being present in any one clock region. This process is referred to as clock domain partitioning or partitioning a circuit design into clock domains.

When performing clock domain partitioning, it is useful not only to generate a solution that does not violate clock domain constraints, but also to generate a solution that achieves satisfactory timing results. Conventional techniques for clock domain partitioning, however, are unable to detect scenarios in which a solution that does not violate clock domain constraints does not exist. In such cases, the circuit design is infeasible since no solution exists that may be practically implemented within the selected programmable IC. In cases where a solution does exist that does not violate clock domain constraints, conventional methods of performing clock domain partitioning are not always able to determine the solution.

SUMMARY OF THE INVENTION

The embodiments disclosed herein relate to partitioning a circuit design into clock domains for implementation within a programmable integrated circuit (IC). One embodiment of the present invention can include a computer-implemented method of partitioning a circuit design into clock domains for implementation within a programmable IC. The method can include storing a plurality of constraints that depend upon a plurality of variables, wherein the plurality of constraints regulate placement of components to different clock regions of the programmable IC. A first objective function can be stored. The method can include determining a result indicating whether a feasible clock domain partitioning exists for the circuit design by minimizing the first objective function subject to the plurality of constraints. The result can be output.

The method can include determining an initial placement of the circuit design by assigning components to sites within clock regions of the programmable IC without adhering to a clock domain constraint restricting a number of global clocks allowed per clock region of the programmable IC.

A first objective function can be defined that includes a penalty term. The penalty term can increase according to distance components are moved from assigned locations within the initial placement. The first objective function also can be defined to include a penalty term that increases according to timing criticality of sources as determined according to the initial placement. Each source can refer to a plurality of components driven by a same global clock within a same clock region of the programmable IC in the initial placement.

Responsive to determining that the circuit design is infeasible, one or more of the plurality of constraints can be modified to include error variables. The error variables can cause a clock domain partitioning to be determined in which a number of global clocks within each clock region is permitted to exceed a maximum number of allowable global clocks. A second objective function can be defined that depends upon a sum of the error variables. The second objective function can be minimized subject to the plurality of constraints. One or more error variables can be output.

The method can include calculating a number of clock regions including a number of global clocks that exceeds the maximum number of allowable global clocks according to nonzero error variables and outputting the number of clock regions that include a number of global clocks that exceeds the maximum number of allowable global clocks. For each nonzero error variable, a value of the nonzero error variable can be output. The value of the nonzero error variable can specify a number of global clocks within a clock region corresponding to the error variable that exceeds the maximum number of allowable global clocks.

Another embodiment of the present invention can include a computer-implemented method of partitioning a circuit design into clock domains for implementation within a programmable IC. The method can include creating an initial placement of the circuit design and storing a plurality of constraints that depend upon a plurality of variables. The plurality of constraints can regulate placement of components to different clock regions of the programmable IC. A first object function defined as $$\sum_{j=0}^{M_D} Y_{skj} \cdot n_{sjk}$$

can be stored, wherein $n_{skj}$ specifies a number of components of a type k that are assigned to a clock region j that are associated with a source s, wherein each source is a plurality of components driven by a same global clock within a same clock region of the programmable IC within the initial placement, and wherein $Y_{skj}$ is a constant factor that imposes a penalty associated with each respective value of $n_{skj}$ according to distance components are moved from assigned locations within the initial placement. A result indicating whether a feasible clock domain partitioning exists for the circuit design can be determined by minimizing the first objective function subject to the plurality of constraints. The result can be output.

Storing a plurality of constraints can include defining a constraint to be $$\sum_{j=0}^{M_D} n_{skj} = A_{sk}, \forall s, k,$$

wherein $M_D$ is a maximum value of j corresponding to a total number of clock regions on the programmable IC and $A_{sk}$ is a number of components of type k that exist within source s. Another constraint can be defined to be $$\sum_{s=0}^{smax} n_{skj} \leq c_{kj}, \forall k, j,$$

wherein $c_{kj}$ is a constant that indicates a number of sites available within clock region j that are of a type k. Another constraint can be defined to be $$q \cdot \sum_{s=0}^{smax} \sum_{k=0}^{kmax} n_{skj} \cdot cl_{is} \geq q \cdot X_{ij} \geq \sum_{s=0}^{smax} \sum_{k=0}^{kmax} n_{skj} \cdot cl_{is}, \forall i, j,$$

wherein q represents value that exceeds a sum of all components that are included in a given clock region j, $X_{ij}$ is a binary variable specifying whether global clock i has a presence in clock region j, and $cl_{is}$ is a binary constant that indicates whether global clock i is found within source s. Yet another constraint can be defined to be $$\sum_{j=0}^{M_D} X_{ij} \leq N_C, \forall j,$$

wherein $M_D$ is a maximum value of i corresponding to a total number of global clocks on the programmable IC, wherein $N_C$ is a maximum number of global clocks allowed within each clock region j.

Responsive to determining that a feasible solution does not exist, the method can include redefining the constraint $$\sum_{i=0}^{M_D} X_{ij} \leq N_C, \forall j \text{ to be } \sum_{i=0}^{M_D} X_{ij} - E_j \leq N_C, \forall j$$

and using a second objective function of $$\sum_{j=0}^{} E_j$$

in lieu of the first objective function. $E_j$ can be a set of error variables that specify a number of global clocks i in each clock region j that exceed $N_C$. The second objective function can be minimized and one or more error variables can be output.

In another aspect, the first objective function can include a penalty factor $P_{skj}$ that is calculated according to timing slack of signals within each source s. In addition, user-specified placement constraints can be specified by setting $N_{skj}$ to zero for each clock region j in which user-specified components of type k are not to be placed.

Yet another embodiment of the present invention can include a computer program product including a computer-usable medium having computer-usable program code that, when executed by a data processing system, causes the data processing system to perform the various steps and/or functions disclosed herein.

BRIEF DESCRIPTION OF THE DRAWINGS

The FIGURE is a flow chart illustrating a method of partitioning a circuit design into clock domains in accordance with the embodiments disclosed within this specification.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to partitioning a circuit design into clock domains for implementation within a programmable integrated circuit (IC). In accordance with the embodiments disclosed within this specification, an integer linear programming (ILP) technique can be used to perform clock domain partitioning upon a circuit design. ILP refers to a technique for optimizing a linear objective function. Optimization of the linear objective function is performed using a plurality of constraints that must be observed, e.g., not violated. These constraints typically are defined as linear equalities and/or linear inequalities. The linear objective function and the constraints, taken collectively, define the ILP problem, or specify an ILP formulation of a problem, to be solved. In this case, the problem to be solved is the partitioning of a circuit design into clock domains that does not violate known clock domain constraints.

Using ILP, circuit designs that are feasible and those that are infeasible, with respect to clock domain partitioning, can be identified. A feasible circuit design refers to one that can be clock domain partitioned in a manner that does not violate the clock domain constraint restricting the number of global clocks that may exist within any one clock region of the programmable IC. An infeasible circuit design refers to one that cannot be clock domain partitioned without violating the clock domain constraint. For those circuit designs that are feasible, the embodiments disclosed herein are guaranteed to find a clock domain partitioning solution that specifies a placement of components within the different clock regions of the programmable IC that does not violate the clock domain constraint.

A "clock region," as used within this specification, refers to a geographic, physical area on the programmable IC within which the circuit design is to be implemented. Typically, the clock region will be a rectangular area on the programmable IC. In general, a programmable IC may include up to M different global clocks, where M is an integer greater than zero. As noted, the restriction on the number of global clocks within any single clock region can be referred to as a "clock domain constraint." Thus, the clock domain constraint for a given programmable IC restricts the number of clocks that may be located within each region to a number, e.g., N, that is less than M. The clock domain constraint may specify that each region of the programmable IC may be restricted to including only N clocks, where N is an integer that is greater than zero and less than M.

The embodiments disclosed within this specification can be implemented in the form of computer program code executing within one or more computers. A "circuit design tool" or "system," as used herein, can refer to one or more computers executing such computer program code to perform the various steps and/or functions described within this specification. The system can operate upon software-based, or programmatic, representations of circuit designs including, but not limited to, netlists, hardware description language representations, or, in some cases, high level programming language representations (hereafter collectively referred to as a "circuit design").

Accordingly, a "computer" suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

The FIGURE is a flow chart illustrating a method 100 of partitioning a circuit design into clock domains in accordance with the embodiments disclosed within this specification. As noted, method 100 can be performed by a computer, executing suitable computer-usable program code to process a circuit design. Beginning in step 105, a circuit design for a programmable IC can be loaded into a system as described above.

In step 110, the system can perform an initial placement of the circuit design which can be stored for later recall and comparison. The system assigns components of the circuit design to different sites on the programmable IC. Each site is located with a particular clock region of the programmable IC. The initial placement is performed without regard for the clock domain constraint. The initial placement can be evaluated in terms of which components are located within each clock region and which global clocks drive those components. Accordingly, the initial placement may violate the clock domain constraint stating that each region of the programmable IC must include N or fewer global clocks of the total M global clocks available within the programmable IC. By the same token, the initial placement may not violate the clock domain constraint. When the clock domain constraint is not violated, a user may choose to continue the process and attempt to further optimize the clock domain partitioning of the circuit design or simply exit the process. When the clock domain constraint is violated by the initial placement, the method can proceed to determine whether a clock domain partitioning of the circuit design exists that does not violate the circuit domain constraint and generate a feasible clock domain partitioning of the circuit design.

Before continuing with FIG. 1, it is useful to define several terms that will be used throughout this specification. As used herein, the term "source," indicated through the subscript s, represents a group of components of a same type driven by a same clock within a single clock region of the programmable IC. For example, a group of components such as lookup tables (LUTs) that are driven by a same clock and that exist in a same clock region will be considered to be part of the same source. A group of flip-flops driven by the same clock as the LUTs within the same clock region would be included within a different source. The sources are defined from the initial placement that is performed in step 110.

The phrase "component type" refers the type of the actual component of the circuit design that is to be implemented at a given site of the programmable IC. Examples of component types can include, but are not limited to, LUTs, flip-flops, block random access memories, digital signal processors, etc. Each component type can be referenced using a unique number. Thus, each different variety of component within the programmable IC can correspond to a component type and be associated with a unique numeric value indicating type. Within this specification, component type will be indicated by the subscript k.

The phrase "clock region" has been defined. Each clock region can be assigned a unique number. Each clock region also can be referenced using the subscript j. The phrase "clock number" refers to a particular global clock of the M global clocks available on the programmable IC. Each global clock can be referenced through a unique number and will be referred to through the subscript i.

In step 115, the variables of the ILP formulation of the clock domain partitioning problem can be defined and stored in memory. Each variable represents a quantity that will be solved using ILP. The variable $N_{skj}$ can be defined. $N_{skj}$ can specify a number of components of type k that are assigned to a clock region j that are associated with a source s. In general, to find a solution to the clock domain partitioning problem using ILP, the various components of each source will be redistributed over the different clock regions of the programmable IC. As this process occurs, the variable $N_{skj}$ will reflect this distribution of components. More particularly, the variable $N_{skj}$ reflects the distribution of a given source s as components of that source are distributed over the different clock regions of the programmable IC.

The variable $X_{ij}$ can be defined. $X_{ij}$ can be a binary variable that indicates whether a particular global clock i has a presence in clock region j. For example, if a component that is driven by a particular global clock i is located within a clock region j, then that global clock i will have a presence in clock region j and $X_{ij}$ will equal "1." If no component driven by global clock i is located within the selected clock region j, then global clock i will not have a presence in the clock region j and $X_{ij}$ will be set equal to "0."

In step 120 the constants for the ILP formulation of the clock domain partitioning problem can be defined and stored in memory. The constant $A_{sk}$ can be defined. $A_{sk}$ can specify the number of components of type k that exist within source s. The constant $CL_{is}$ can be defined. $CL_{is}$ can be a binary constant that indicates whether global clock i is found within source s. $C_{kj}$ can be defined. $C_{kj}$ can be a constant that indicates the number of sites of component type k that exist, or are available, in clock region j. The constant $C_{kj}$ is a capacity constraint that specifies the site capacity of a selected clock region on a per component type basis.

In step 125, the constraints for the ILP formulation of the clock domain partitioning problem can be defined and stored in memory. Within this specification, capital letters will be used to represent a matrix. Lower case letters will be used to denote the elements of that matrix. Thus, for example, the variable $n_{skj}$ references an element within the $N_{skj}$ three dimensional matrix.

The constraints are expressions that define relationships between the variables and constants that have been defined for the ILP formulation of the clock domain partitioning problem within this specification. Constraint 1 can be defined as $$\sum_{j=0}^{M_D} n_{skj} = A_{sk}, \forall s, k.$$

Recall that $N_{skj}$ specifies the number of components of type k that are assigned to region j and that also are associated with source s. Recall also that that $A_{sk}$ specifies the number of components of type k that exist within source s. Accordingly, this constraint states that the sum of the elements $n_{skj}$, from j=0 to $M_D$, where $M_D$ represents the maximum value of j (clock regions), for all values of s and for all values of k will sum to the constant $A_{sk}$.

In other words, constraint 1 specifies that the sum of the distributed components must be equal to the total number of components in the source. If, for example, a given source s has 100 components, despite the different clock regions to which components of that source may be distributed, the source will always have a total of 100 components when summed. This constraint effectively enforces the notion that each component of a given source s is assigned to one and only one clock region at any given time.

Constraint 2 can be defined as $$\sum_{s=0}^{smax} n_{skj} \leq c_{kj}, \forall k, j.$$

Recall that $C_{kj}$ is a constant that indicates the number of sites of a type k that are available within a given clock region j. Accordingly, constraint 2 states that the sum of the elements $n_{skj}$ from j=0 to s max, where s max represents the maximum value of s (sources), for all values of k and for all values of j, will sum to the constant $c_{kj}$. Constraint 2 specifies that the sum of all of the components of a same type that are assigned to a same clock region cannot exceed the capacity of that clock region, e.g., the number of available sites, for the specified component type. For example, if a given clock region has only 100 available sites for flip-flops, that clock region cannot accept more than 100 flip-flops in total from all sources.

Constraint 3 can be defined as $$q \cdot \sum_{s=0}^{smax} \sum_{k=0}^{kmax} n_{skj} \cdot cl_{is} \geq q \cdot X_{ij} \geq \sum_{s=0}^{smax} \sum_{k=0}^{kmax} n_{skj} \cdot cl_{is}, \forall i, j.$$

Constraint 3 can be more easily represented as q·sum≧q·$X_{ij}$≧sum, ∀i, j, where $$\text{sum} = \sum_{s=0}^{smax} \sum_{k=0}^{kmax} n_{skj} \cdot cl_{is}.$$

Constraint 3 is a fixed point charge constraint that forces the value of $X_{ij}$ to be either "1" or "0" based upon the sum. The result of constraint 3 is that $X_{ij}$ is forced to be "1" when sum is a non-zero, positive value. When sum is "0," $X_{ij}$ is forced to be "0."

Recall that $CL_{is}$ is a binary constant that indicates whether a global clock i is found within a selected source s and that $N_{skj}$ specifies the number of components of type k that are assigned to region j that are associated with source s. The sum term, which multiplies $N_{skj}$ by the binary constant $CL_{is}$, effectively goes through each source s, takes all components of the source assigned to the selected clock region j, and multiplies that number (the $N_{skj}$ term) by zero or one (the $CL_{is}$ term) according to whether clock i is present within the subject clock region j. Multiplication by the term $CL_{is}$ removes components of a source that are driven by a global clock that is not present within the subject clock region. The end result is a total of the number of components within the clock region i that are driven by a given global clock i. If this number is greater than zero, the global clock that drives those components must be present within the clock region.

Taking the middle expression $q \cdot X_{ij}$ of the constraint 3, this expression must be greater than or equal to the sum term in reference to the right side of constraint 3. The expression q·sum on the left side of constraint 3 must be greater than or equal to $q \cdot X_{ij}$. Recalling that $X_{ij}$ is a binary variable specifying whether global clock i is within clock region j, and presuming q to be some large value such as infinity, for example, it can be seen than when sum is a nonzero positive number, $X_{ij}$ must be one. The value of q, for example, can be set to a value that is higher than, or exceeds, the total number of components that can fit in a given clock region j within the circuit design being processed. In one embodiment, the maximum value of q can be defined as $$\sum_{j=0}^{jmax} \sum_{k=0}^{kmax} c_{kj}.$$

In illustration, if the number of components driven by global clock 3 within clock region 3 is a nonzero, positive number, then $X_{3,3}$ must be equal to one in order for constraint 3 to hold true.

Constraint 4 can be defined as $$\sum_{i=0}^{M_D} X_{ij} \leq N_C, \forall j.$$

Constraint 4 sums the binary variables $X_{ij}$ over the global clocks, e.g., from i=0 to i=$M_D$, which represents the maximum value of i for all j. This value must be less than the constant $N_C$, which is the maximum number of global clocks allowed within any single clock region. Constraint 4 establishes a link or relationship between $N_{skj}$ and $X_{ij}$.

In step 130, any user-specified placement constraints can be defined and stored in memory for use in solving the ILP formulation of the clock domain partitioning problem. In some cases a user may specify that particular components of the circuit design must be placed at a particular site or within a particular clock region of the programmable IC. In one embodiment, the user-specified placement constraints for a given component can be implemented by setting particular variables of the ILP formulation to zero as opposed to creating new constraints. For example, the $N_{skj}$ variable can be set to zero for each clock region j in which the user-specified components of source s and of type k are not to be placed. Handling the user-specified placement constraints in this manner simplifies the ILP formulation of the clock domain partitioning problem in that the resulting size of the ILP formulation is reduced.

In step 135, the objective function for the ILP formulation of the clock domain partitioning problem can be defined and stored in memory. It should be appreciated that any of a variety of objective functions can be used to determine whether a clock domain partitioning of a circuit design is feasible. An objective function, however, can be specified in a way that meets an additional goal in order to locate or identify the "best" solution, per the objective function, of the ILP formulation.

Accordingly, in one embodiment, the objective function can be defined as $$\min \sum_{j=0}^{M_D} Y_{skj} \cdot n_{sjk}.$$

The goal of this objective function is to move the fewest number of components possible from their respective locations within the initial placement. This objective function effectively works on the premise that the original placement was an acceptable placement of the circuit design, except for any violations of the clock domain constraint. Recall that $N_{skj}$ is the number of components in source s of type k assigned to clock region j. In this objective function, $Y_{skj}$ represents a constant factor that is a penalty associated with each respective value of $N_{skj}$.

In general, the penalty term $Y_{skj}$ can be calculated by determining the distance between the location assigned to a component in the initial placement component and the final placement of the component after clock domain partitioning. This distance may be calculated using Manhattan distance, e.g., computed in clock regions. In the event that one or more components are not moved from their initial locations in the initial placement, the penalty term $Y_{skj}$ for those components will be zero. When a component is moved four clock regions away from the location of the component in the initial placement of that component, the penalty term $Y_{skj}$ will be 4. By minimizing the cost function, a feasible clock domain partitioning may be achieved, when possible, that moves each component the smallest distance from the location of the component within the initial placement.

In another embodiment, the objective function can be changed to facilitate finding a placement that results in the best quality of results (QOR). The QOR of a placement typically is measured in terms of the fastest clock frequency at which the circuit design will operate. For example, the objective function can be defined as $$\min \sum_{j=0}^{M_D} P_{skj} \cdot Y_{skj} \cdot n_{skj}.$$

This objective function incorporates an additional penalty factor $P_{skj}$. As a result, the QOR enhanced objective function attempts to keep the sources determined to be the most critical in terms of timing as close as possible to their original locations while still providing superior timing results.

$P_{skj}$ can be calculated by performing a timing analysis of the initial placement of the circuit design. The timing analysis can determine which sources are timing critical and which sources are non-timing critical. A measure of slack for each source can be calculated. A negative slack can indicate a timing path that the system has determined to be critical in that the timing, or signal, path will not meet the timing constraint associated with that timing path. That is, the estimated delay of the timing path is larger than allowed as specified by the timing constraint for the timing path. The slacks for each component of each source can be summed to determine the measure of slack for each source. Again, the more negative the slack, the more critical the source in terms of timing.

All sources can be ranked from the most critical to the least critical, e.g., from the largest negative slack to the largest positive slack. The sources can be numbered with a criticality rank, denoted as CR, from 1, corresponding to the largest negative slack, to NS, where NS is the total number of sources and also corresponds to the CR of the source with the largest positive slack. The penalty factor $P_{skj}$ can be calculated as $$P_{skj} = \left(1 - \frac{CR}{NS}\right).$$

Taking an example where there are 5 sources, the penalty factor $P_{skj}$ will be calculated as follows for sources 1-5, ordered from most critical to least critical.

$$\text{Source with } CR = 1, P^s_{kj} = \left(1 - \frac{CR}{NS}\right) = 1 - \frac{1}{5} = 0.8$$

$$\text{Source with } CR = 2, P^s_{kj} = \left(1 - \frac{CR}{NS}\right) = 1 - \frac{2}{5} = 0.6$$

$$\text{Source with } CR = 3, P^s_{kj} = \left(1 - \frac{CR}{NS}\right) = 1 - \frac{3}{5} = 0.4$$

$$\text{Source with } CR = 4, P^s_{kj} = \left(1 - \frac{CR}{NS}\right) = 1 - \frac{4}{5} = 0.2$$

$$\text{Source with } CR = 5, P^s_{kj} = \left(1 - \frac{CR}{NS}\right) = 1 - \frac{5}{5} = 0.0$$

As shown, the most critical source is accorded the highest penalty, whereas the least critical source is accorded no penalty. It should be appreciated that other mechanisms for imposing penalties can be used. As such, the embodiments disclosed within this specification are not intended to be limited to the examples provided.

In one embodiment, the objective function can be a first objective function that may be used. In cases where no solution is found to exist, the objective function can be modified as will be described herein to result in a second objective function that can be used for purposes of debugging the circuit design.

In step 140, the ILP formulation of the clock domain partitioning problem can be solved. The constraints, constants, and the objective function described within this specification can be provided to an ILP solver as input. Any of a variety of different publicly or commercially available, software-based ILP solvers may be used. Typically, when no solution to the ILP formulation exists, the ILP solver will output "garbage," e.g., nonsensical results. This indicates that the circuit design is not feasible. When a solution does exist, the ILP solver will output a solution that is feasible, and further, will specify a valid clock domain partitioning for the circuit design. The solution, in reference to the clock domain partitioning, will specify, through the variables for which values have been determined, an assignment of components to locations, or sites, within the various clock domains of the programmable IC.

In step 145, the ILP solver can output a solution to the ILP formulation of the clock domain problem. As used herein, "outputting" and/or "output" can mean, for example, writing to a file or memory, writing to a user display or other output device, playing audible notifications, sending or transmitting to another system, exporting, or the like.

In step 150, a determination can be made as to whether the circuit design is feasible based upon the output from the ILP solver. When the circuit design is feasible and a valid, e.g., feasible, clock domain partitioning is achieved, the method can end. When the circuit design, or clock domain partitioning, is infeasible, the method can proceed to step 155, where the ILP formulation of the clock domain partitioning problem can be redefined to provide the end user with additional information that may be helpful in debugging the circuit design.

In step 155, one or more of the constraints of the ILP formulation can be modified and stored in memory. As noted, ILP techniques are able to provide a solution or, when a solution does not exist, return garbage results. In effect, ILP yields an "all or nothing" result. By modifying one or more of the constraints of the ILP formulation, a partial solution to the clock domain partitioning problem may be achieved. The partial solution may provide a user with enough information to debug the circuit design and ultimately achieve a feasible circuit design with respect to clock domain partitioning.

After the circuit design is determined to be infeasible, e.g., a clock domain partitioning having fewer than $N_c$ clocks within each clock region does not exist, error variables $E_1$ can be introduced into the ILP formulation. In particular, constraint 4, which was $$\sum_{i=0}^{M_D} X_{ij} \leq N_C, \forall j,$$

can be redefined or modified as $$\sum_{i=0}^{M_D} X_{ij} - E_j \leq N_C, \forall j.$$

The original form of constraint 4 ensured that the number of global clocks assigned to each clock region did not exceed $N_C$ out of M total global clocks. By inserting the additional error variables $E_j$, constraint 4 will always be satisfied and a feasible solution may be achieved. A truly feasible solution will exist when all error variables are zero. By comparison, each clock region corresponding to a nonzero error variable is oversubscribed. In general, the error variables, which exist at a per clock region level, can be subtracted from the number of clocks within each respective clock region so that the resulting number of clocks within each clock region will always be less than the maximum number of clocks $N_C$ allowed. The ILP formulation is effectively altered to allow an infeasible solution to be output in a manner that conveys useful information.

In step 160, the objective function can be redefined, or modified, to be min $$\sum_{j=0} E_j,$$

thereby forming a second objective function. By seeking to minimize the sum of the error variables, a clock domain partitioning solution can be found that violates the maximum allowed clock domain constraint the least. While the solution will be infeasible, the solution will be infeasible to a lesser degree than any other solution.

In step 165, the new ILP formulation of the clock domain partitioning problem, e.g., the same ILP formulation with the now modified constraint 4 and the second objective function, can be solved. In step 170, the solution can be output. The solution to the ILP formulation provides the user with several pieces of data. One piece of data is that the number of nonzero error variables indicates the number of clock regions that are over subscribed, e.g., have more than the maximum number of allowed global clocks. Another piece of data is that the value of each error variable indicates the number of global clocks exceeding the maximum number of allowable global clocks in that clock region.

Steps 155, 160, 165, and 170 are performed only when the ILP solver determines that no solutions exist to the clock domain partitioning problem. As such, the ILP formulation is changed to permit an infeasible solution to be output. Otherwise, a designer is left with no information as to how close the circuit design is to being feasible with respect to clock domain partitioning.

The flowchart in the FIGURE illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the FIGURE. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of partitioning a circuit design into clock domains for implementation within a programmable integrated circuit (IC), the method comprising:

storing a plurality of constraints that depend upon a plurality of variables, wherein the plurality of constraints regulate placement of components to different clock regions of the programmable IC;

determining, using a processor, a result indicating whether a feasible clock domain partitioning exists for the circuit design by minimizing a first objective function subject to the plurality of constraints;

responsive to determining that the circuit design is infeasible, modifying at least one of the plurality of constraints to include error variables, wherein the error variables cause a clock domain partitioning to be determined in which a number of global clocks within each clock region is permitted to exceed a maximum number of allowable global clocks;

defining a second objective function that depends upon a sum of the error variables; and minimizing the second objective function subject to the plurality of constraints.

2. The computer-implemented method of claim 1, further comprising determining an initial placement of the circuit design by assigning components to sites within clock regions of the programmable IC without adhering to a clock domain constraint restricting a number of global clocks allowed per clock region of the programmable IC, wherein the clock domain constraint is one of the plurality of constraints.

3. The computer-implemented method of claim 2, further comprising defining the first objective function to comprise a penalty term that increases according to distance components are moved from assigned locations within the initial placement.

4. The computer-implemented method of claim 2, further comprising defining the first objective function to comprise a penalty term that increases according to timing criticality of sources as determined according to the initial placement, wherein each source is a plurality of components driven by a same global clock within a same clock region of the programmable IC in the initial placement.

5. The computer-implemented method of claim 1, further comprising:
   calculating a number of clock regions comprising a number of global clocks that exceeds the maximum number of allowable global clocks according to nonzero error variables; and
   outputting the number of clock regions comprising a number of global clocks that exceeds the maximum number of allowable global clocks.

6. The computer-implemented method of claim 1, further comprising, for each nonzero error variable, outputting a value of the nonzero error variable, wherein the value of the nonzero error variable specifies a number of global clocks within a clock region corresponding to the error variable that exceeds the maximum number of allowable global clocks.

7. A computer program product comprising:
   a non-transitory computer-usable medium comprising computer-usable program code that when executed by a computer partitions a circuit design into clock domains for implementation within a programmable integrated circuit (IC), the computer-usable medium comprising:
   computer-usable program code that stores a plurality of constraints that depend upon a plurality of variables, wherein the plurality of constraints regulate placement of components to different clock regions of the programmable IC;
   computer-usable program code that determines a result indicating whether a feasible clock domain partitioning exists by minimizing a first objective function subject to the plurality of constraints;
   computer-usable program code that, responsive to determining that the circuit design is infeasible, modifies at least one of the plurality of constraints to include error variables, wherein the error variables cause a clock domain partitioning to be determined in which a number of global clocks within each clock region is permitted to exceed a maximum number of allowable global clocks;
   computer-usable program code that defines a second objective function that depends upon a sum of the error variables; and
   computer-usable program code that minimizes the second objective function subject to the plurality of constraints.

8. The computer program product of claim 7, wherein the computer-usable medium further comprises computer-usable program code that determines an initial placement of the circuit design by assigning components to sites within clock regions of the programmable IC without adhering to a clock domain constraint restricting a number of global clocks per clock region of the programmable IC, wherein the clock domain constraint is one of the plurality of constraints.

9. The computer program product of claim 8, wherein the computer-usable medium further comprises computer-usable program code that defines the first objective function to comprise a penalty term that increases according to distance components are moved from assigned locations within the initial placement.

10. The computer program product of claim 8, wherein the computer-usable medium further comprises computer-usable program code that defines the first objective function to comprise a penalty term that increases according to timing criticality of sources as determined according to the initial placement, wherein each source is a plurality of components driven by a same global clock within a same clock region of the programmable IC in the initial placement.

11. The computer program product of claim 8, wherein the computer-usable medium further comprises:
   computer-usable program code that calculates a number of clock regions comprising a number of global clocks that exceeds the maximum number of allowable global clocks according to nonzero error variables; and
   computer-usable program code that outputs the number of clock regions comprising a number of global clocks that exceeds the maximum number of allowable global clocks.

12. The computer program product of claim 8, wherein the computer-usable medium further comprises:
   computer-usable program code that, for each nonzero error variable, outputs a value of the nonzero error variable, wherein the value of the nonzero error variable specifies a number of global clocks within a clock region corresponding to the error variable that exceeds the maximum number of allowable global clocks.

* * * * *